United States Patent [19]

Gleason

[11] Patent Number: 5,263,173
[45] Date of Patent: Nov. 16, 1993

[54] HIGH SPEED CLOCKED OUTPUT DRIVER FOR SWITCHING LOGIC LEVELS OF AN OUTPUT PAD AT INTEGER AND INTEGER AND A HALF CLOCK CYCLES

[75] Inventor: Craig A. Gleason, Ft. Collins, Colo.

[73] Assignee: Hewlett-Packard Company, Palo Alto, Calif.

[21] Appl. No.: 727,690

[22] Filed: Jul. 19, 1991

[51] Int. Cl.$^5$ .............................................. G06F 1/04
[52] U.S. Cl. ..................... 395/800; 395/550; 307/412; 307/451; 307/452; 364/932.8; 364/935.42; 364/934.2; 364/DIG. 2
[58] Field of Search ................ 395/800, 550; 307/412, 307/451, 452

[56] References Cited

U.S. PATENT DOCUMENTS

| | | | |
|---|---|---|---|
| 4,649,299 | 3/1987 | Yamanouchi | 307/480 |
| 4,797,579 | 1/1989 | Lewis | 307/443 |
| 4,940,904 | 7/1990 | Lin | 307/262 |
| 4,975,599 | 12/1990 | Petrovick, Jr. et al. | 307/443 |
| 5,030,904 | 7/1991 | Tanksalvala et al. | 324/158 R |
| 5,097,148 | 3/1992 | Gabara | 307/443 |
| 5,117,133 | 5/1992 | Luebs | 307/471 |

OTHER PUBLICATIONS

"CMOS PA-RISC Processor For a New Family of Workstations", by M. Forsyth et al., IEEE COMPCOM Spring '91 Digest of Papers; Feb. 1991.

"System Design for a Low Cost PA-RISC Desktop Workstation", by R. Horning et al., IEEE COMPCOM Spring '91, Digest of Papers; Feb. 1991.

"Architecture and Compiler Enhancements for PA--RISC Workstations", by D. Odnert et al., IEEE COMPCOM Spring '91 Digest of Papers; Feb. 1991.

Primary Examiner—Thomas C. Lee
Assistant Examiner—Paul Harrity

[57] ABSTRACT

An output driver and method including an output pad, for performing write operations from a central processor unit to a cache memory. The driver includes a pull-up circuit electrically connected to the output pad for switching the pad to a first logic state and a pull-down circuit electrically connected to the output pad for switching it to a second logic state. A plurality of signals are input to the pull-up and pull-down circuits to perform the switching of the output pad at integer and integer and a half clock cycles.

4 Claims, 8 Drawing Sheets

HIGH SPEED CLOCKED OUTPUT DRIVER FOR SWITCHING LOGIC LEVELS OF AN OUTPUT PAD AT INTEGER AND INTEGER AND A HALF CLOCK CYCLES

TECHNICAL FIELD

The present invention is directed to a system and method for transmitting information between two or more devices at integer and a half clock cycles. More particularly, the invention is directed to an ASIC output driver for outputting addresses from a central processor unit (CPU) to a instruction cache memory.

BACKGROUND ART

It is common for electronic devices to communicate directly or indirectly with each other. A major problem, however, is that not all devices are capable of performing operations at the same maximum speed. A conventionally technique used to overcome this problem is to adjust the speed of one of the devices. Typically the speed of the fastest machine is changed. This of course results in reduced overall system performance.

The simplest way to adjust the speed of a CPU-based device is to perform operations at integer multiples of the CPU's clock speed. For instance, consider a system in which a CPU permits two peripheral devices to communicate with each other, in which the CPU performs operations at 50 MHz, the first device runs at 20 MHz and the second device runs at 25 MHz.

The goal is to cycle data transfers between devices 1 and 2 at the highest possible rate. The CPU's frequency is not an integer multiple of the two lower frequencies, but the overall frequency of the system is limited to integer multiples of the CPU's clock frequency. Hence, transfers must be done once every two cycles, or once every three cycles, and the frequency of the CPU and chip 1 would have to be adjusted.

DISCLOSURE OF THE INVENTION

The present invention is directed to an output system and method for performing write operations from a central processor unit to a cache memory. The system comprises a pull-up circuit electrically connected to an output pad for switching the pad to a first logic state, a pull-down circuit electrically connected to the output pad for switching the pad to a second logic state and a plurality of signals input to the pull-up and pull-down circuits to perform the switching of the output pad at integer and a half clock cycles.

The pull-up circuit may further include a first precharging subcircuit for placing a first node in the first logic state, a first pull-down subcircuit for placing the first node in the second logic state and a first switch connected to and controlled by the first node for connecting the output pad to a first voltage potential to achieve the first logic state. The pull-down circuit may further include a second precharging subcircuit for placing a second node in the first logic state, a second pull-down subcircuit for placing the second node in the second logic state and a second switch connected to and controlled by the second node for connecting the output pad to a second voltage potential to achieve the second logic state.

BRIEF DESCRIPTION OF THE DRAWINGS

The invention will be better understood if reference is made to the accompanying drawings in which.

BEST MODE FOR CARRYING OUT THE INVENTION

An overall system which incorporates the present invention is generally described in an article by M. Forsyth et al. titled, "CMOS PA-RISC Processor For a New Family of Workstations," *IEEE COMPCOM Spring '91 Digest of Papers*, February 1991. The environment described in this article is only one of many computer systems in which the present invention could be used. The Forsyth article is incorporated herein by reference as if set forth below in full.

Figure 1:
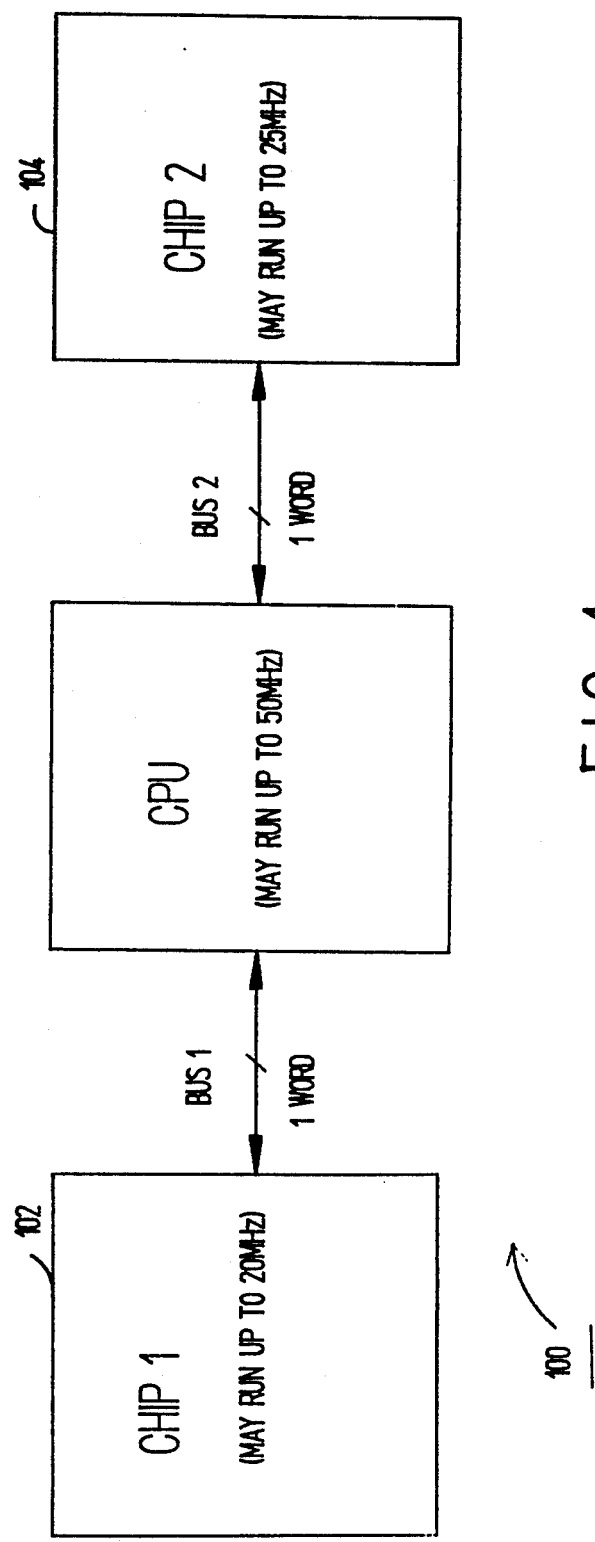
FIG. 1 shows a high level diagram of a hardware system in conjunction with an embodiment the present invention.

A 1.5 cycle driver in conjunction with the system and method of the present invention (the present invention) will now be described with reference to FIGS. 1 and 2. As shown in FIG. 1, Chips 1 and 2 are either synchronous parts running at frequencies lower than the master chip (for example a CPU) frequency, or asynchronous parts that have timing that requires the system to run certain transactions at speeds lower than the CPU frequency.

The basic case involves trying to cycle data transfers between the CPU and chips 1 and 2 at the highest possible rate. (Recall the example discussed above in conjunction with the related art.) If the CPU's frequency is not an integer multiple of the two lower frequencies, the overall frequency can be improved if the system is able to use not just integer multiples, but integer and a half multiples of the two lower frequencies.

For instance, with the CPU running at 50 MHz and chip 1 running at 20 MHz, the system could cycle bus transfers once every two and a half CPU cycles. Compare this to running transfers once every two cycles, or once every three cycles, where the frequency of the CPU and chip 1 would have to be adjusted.

This half CPU cycle adjustment provides more flexibility for maximizing the performance of all the chips.

Figure 2:
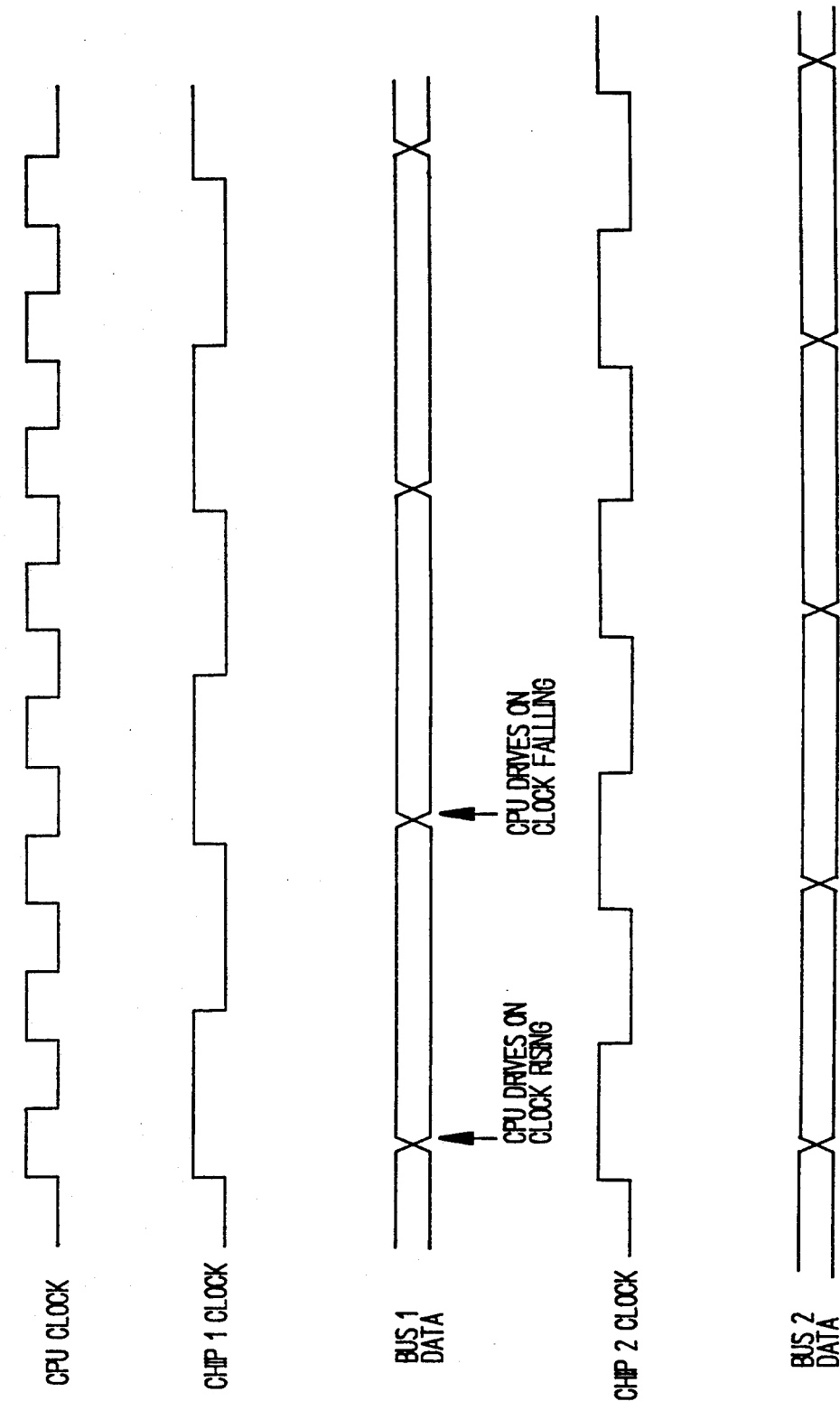
FIG. 2 shows a general timing diagram for the system shown in FIG. 1.

FIG. 2 shows the relationship of the clocks on these three different chips, where the CPU is running two and a half times the frequency of chip 1, and two times the frequency of chip 2. The figure shows when the data would change on the buses between the CPU and chip 1 and chip 2. In the case of bus 1 where it's an integer and a half multiple, data is cycled once every two and a half CPU cycles. Note that the CPU can drive on both rising and falling edges of the clock.

Figure 3:
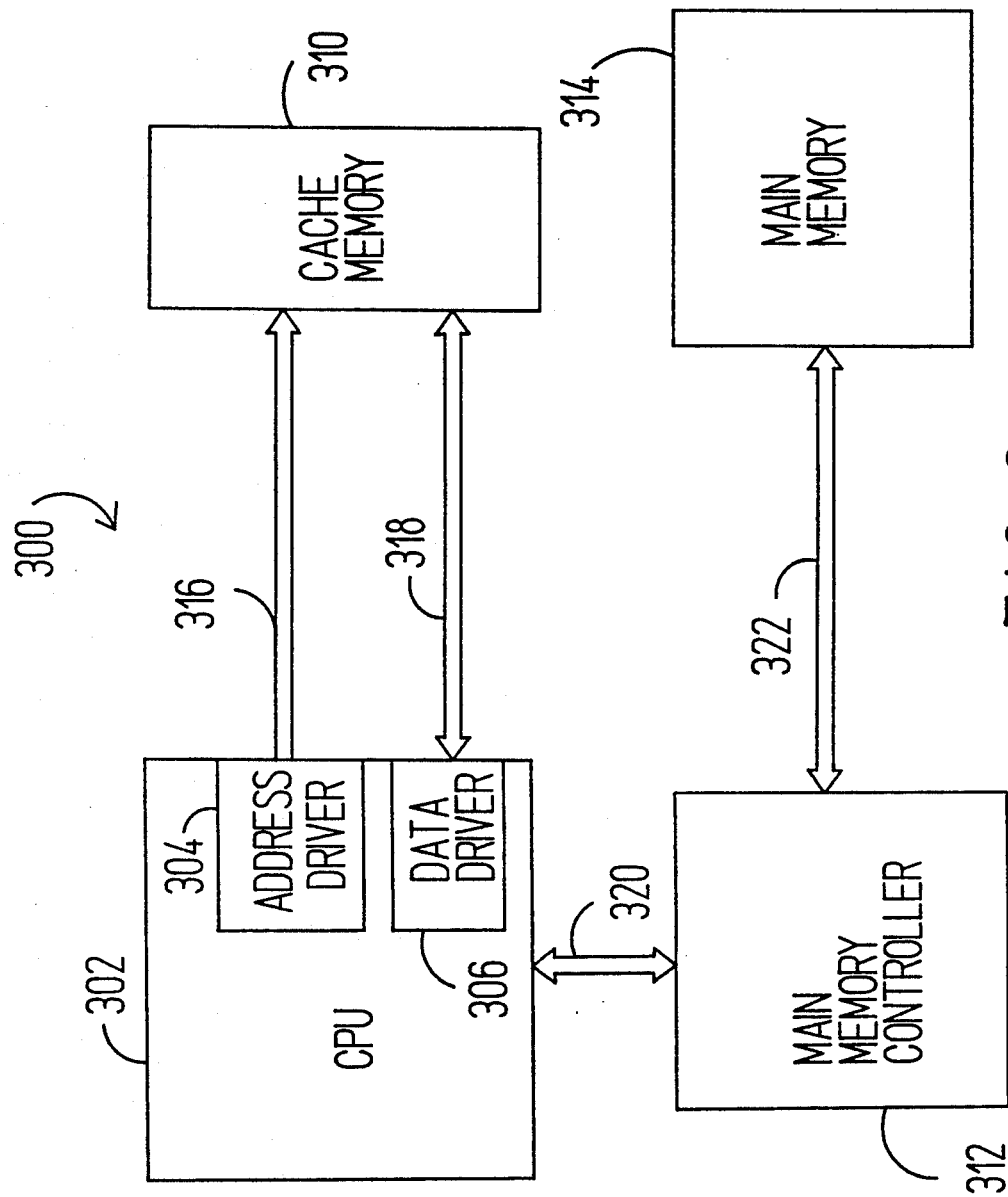
FIG. 3 shows a high level diagram of a hardware system to implement the present invention.

A preferred embodiment of an application specific integrated circuit (ASIC) output driver in conjunction with the present invention will now be discussed with reference to FIG. 3. FIG. 3 shows a computer system 300, including a general purpose computer (CPU) 302. In addition to the usual components found in a standard CPU, the CPU 302 includes an address driver 304 and a data driver 306. Also shown in FIG. 3 is a main memory 312 and a main memory controller 314.

An example of the computer system 300 is Hewlett-Packard Company's HP 9000, Series 700 computer, implementing Hewlett-Packard's PA-RISC system architecture.

Those skilled in the art will be familiar with the general operation of a CPU. Hence, a detailed discussion of the CPU will be omitted.

It is desired to optimize the system frequency for the read cycle from the cache. The goal is to get one 32 bit instruction out of the off-chip instruction cache 310 every CPU cycle at the highest possible frequency. The system is thus configured to perform read operations every CPU cycle using the standard asynchronous static random access memory chips (SRAMs). However, it is not possible to write one 32 bit word per CPU cycle, because the of the time required to disable the SRAMs from driving the bus and then enable the CPU drivers, once the address is changed.

To optimize the system frequency for the read cycle would therefore require writing of instructions to the cache memory 310 every two CPU cycles. Therefore, it would require a total of 16 CPU cycles to write every cache line (e.g., each cache line comprises eight 32 bit words; other implementations may use different sized words).

The cache instruction memory 310 stores a set of cache lines, each line includes eight 32 bit words, for example. Associated with every cache line is a tag. The tag contains part of the real address corresponding to the cache line at a particular location in the cache memory.

The CPU 302 includes a mechanism for translating between virtual and real addresses. This capability is commonly built-in to the CPU itself. Every time the CPU accesses an address whether for data access or for an instruction address, the CPU does the translation internally so that while it is issuing the virtual address it also determines what real address that corresponds to. The CPU 302 sends a portion of the virtual address out on a bidirectional cache address bus 316 which causes a data and a tag to be returned by the cache memory 310 to the CPU 302 via a cache data bus 318. Alternatively, the tag may be transferred on a separate bus.

In this example the address bus 316 is only 18 bits wide. Because the cache is smaller that the total size of the main memory 314, it is accessed by only a portion of the virtual address. Thus, the bandwidth of the bus is reduced.

Data is communicated back and forth between the CPU 302 and the cache memory 310 over a bidirectional bus 318. In this example, the data bus 318 is 32 bits wide.

A "cache miss" occurs if the line retrieved from the cache memory does not contain the correct real address. The CPU must then send the real address to the main memory controller 312 over a bidirectional processor-to-memory bus 320. The main memory controller 312 will use that real address to access the main memory 314 over a bidirectional main memory bus 322.

The processor-to-memory bus 320 is 32 bits wide and the main memory bus 322 is 64 bits wide, for example.

The main memory controller 312 will then send back eight words from the main memory to become the cache line for that specific address. Those eight words will go through the CPU's data driver 306 and be copied into the cache memory 310.

Figure 4:
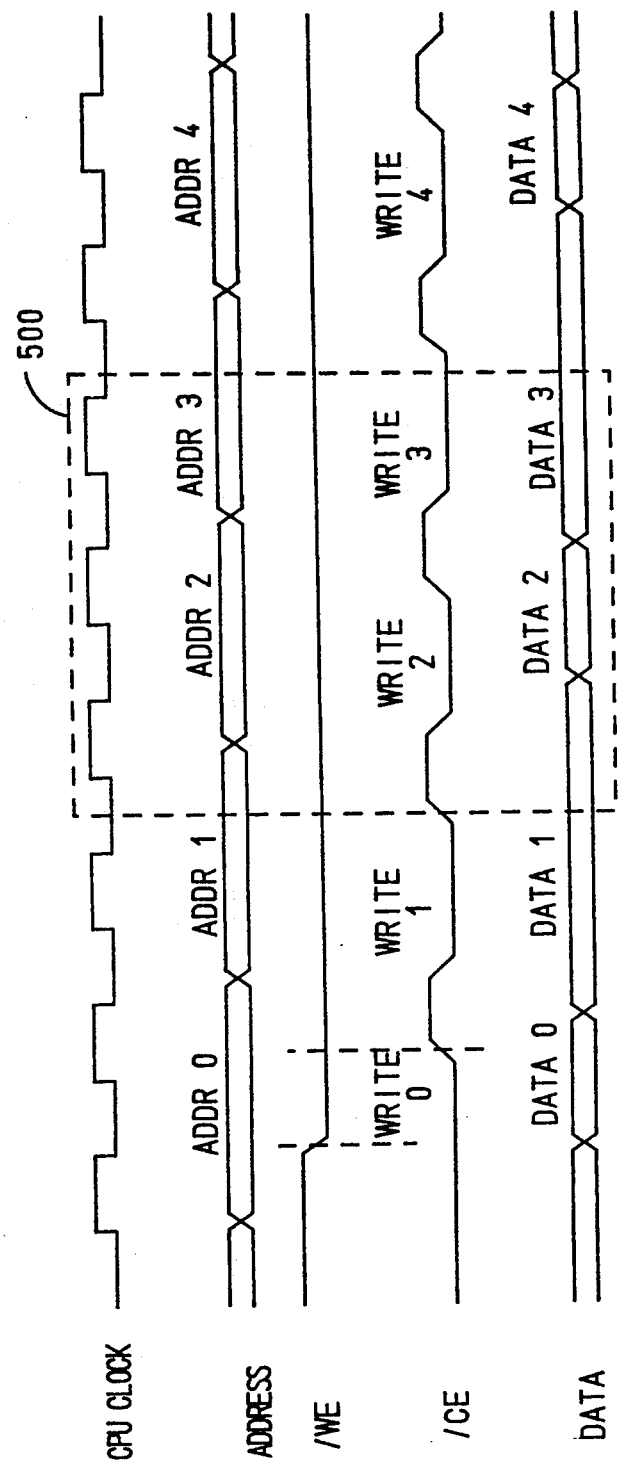
FIG. 4 shows a timing diagram for a cache copyin operation in conjunction with the present invention.

FIG. 4 is a timing diagram showing the timing used during a 1.5 cycle "copyin" cycle for writing data into the cache memory. The first five writes into the cache are shown (see WRITE 0–WRITE 4, etc.). The CPU clock signal is at the top of FIG. 4. The signals shown below the clock signal are the address, write enable (W/E), chip enable (C/E) and data signals, respectively.

The present invention can not drive on consecutive half cycles. It can drive on consecutive cycles, or every third half cycle. The "1.5 cycle" noted above refers to the ability of the present invention to drive on every third half cycle.

The address changes every three half-cycles, as shown at ADDRESS 0–ADDRESS 4, etc. There are eight total writes strung together per cache line copyin.

The SRAM has the two controls, write enable and chip enable. Chip enable places the chip in a condition in which it is neither reading nor writing. Both control signals are active low so that in normal operation (i.e., reading from the SRAM) the chip enable is electrically set LOW and the write enable set HIGH.

At the beginning of the timing diagram (the left hand side), the chip enable begins LOW and the write enable starts HIGH. This indicates that previously a read operation was being conducted from the RAM. This is a basic default state.

In the present example embodiment these are separate data and instruction caches. The present invention concerns only the instruction cache. The present invention could, however, be applied to the data cache given the same constraints. In the present example it is assumed that there is a 64 bit path to the data cache. Copying in 64 bits/two cycles matches the bandwidth of 32 bits/cycle on the processor-to-memory bus.

As shown in FIG. 4, the CPU writes to the RAM when both chip enable and write enable are LOW. A constraint of the system is that the address can only be changed when either or both of the two controls is HIGH, otherwise a changing address may create an undetermined state.

The write enable is set LOW, and is kept LOW for the duration of the copyin. Then the chip enable is set LOW to begin writing. So we've got the first address set on. And we try for the first piece of data. The chip enable is then brought HIGH to complete the first write, shown as WRITE 0 in FIG. 4. Each piece of data shown in FIG. 4 is 32 bits. DATA 0 is written during WRITE 0, DATA 1 is written during WRITE 1, and so on.

Then the CPU is free to change the address, and in this case, it can also change data at the same time. The chip enable is set LOW again to start the second write.

It is worth noting that the data doesn't have to be stable during the entire write. It has some set up time to the end of the write, which allows the CPU to change the data in the middle of the write. However, the address must be stable through the whole write cycle.

The flexible data transition is due to the inherent setup time of the SRAMs employed in the cache memory.

Standard "15 nanosecond" RAMs have a read access time of 15 nanoseconds (ns). The write pulse width for these RAMs is typically 12 nanoseconds. The write pulse width is the time when the address is valid and both chip enable and write enable are LOW. Furthermore, the data set-up time for a 15 ns RAM is typically 8 ns. The data set-up time is the time from valid data on the RAM's input to the time writing is completed by either chip enable or write enable going HIGH. Thus, the data must be valid for the last 8 ns of the write window. This is shown in FIG. 5.

Figure 5:
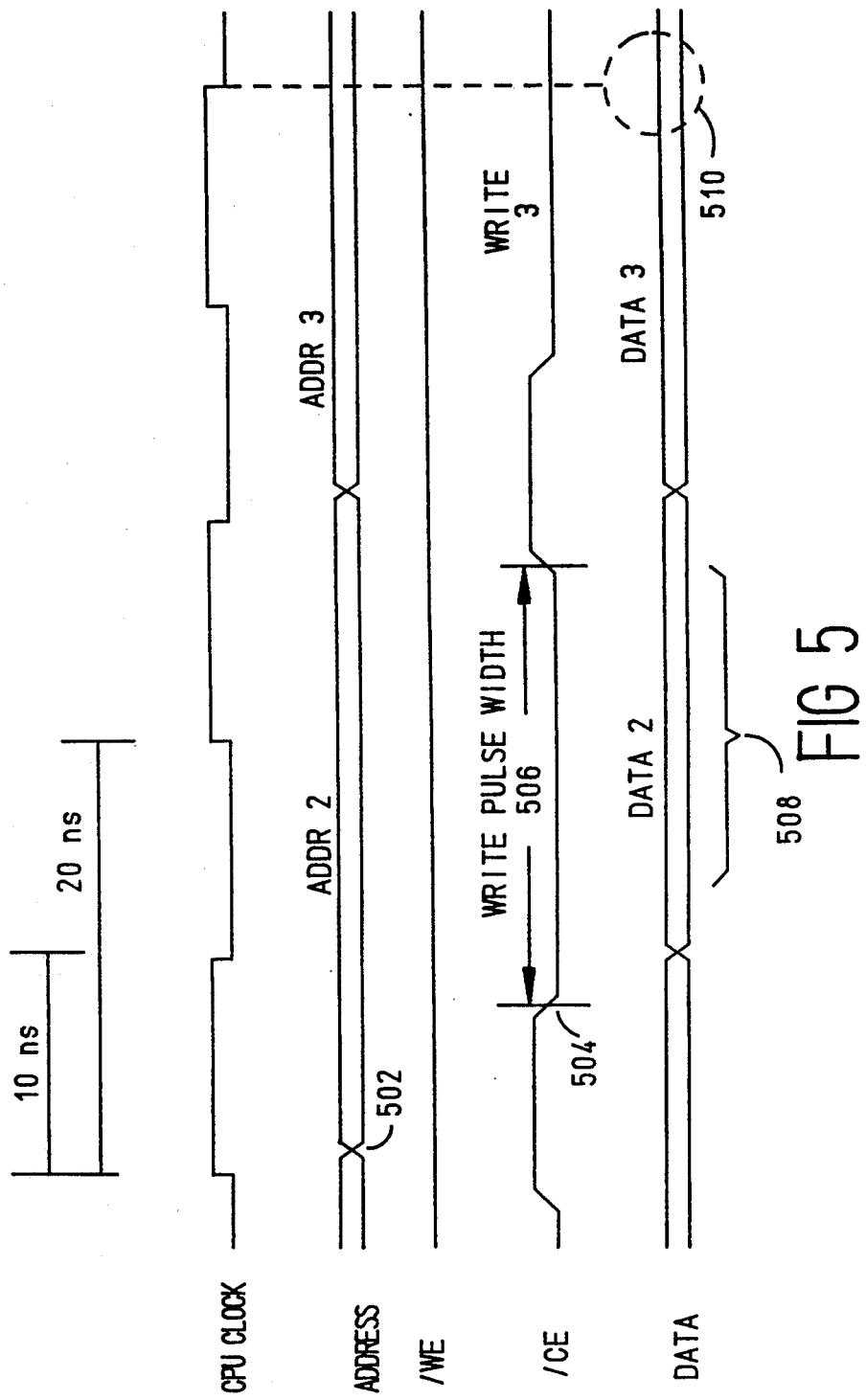
FIG. 5 shows a timing diagram for writing to the cache memory in conjunction with the present invention.

FIG. 5 is an expanded view of the cache write timing shown at section 500 in FIG. 4. Assuming the CPU clock is 50 MHZ, and 15 ns SRAMs, each half clock cycle is 10 ns and a full clock cycle is 20 ns. The write enable is maintained low and the address of the data to be written is setup just after the rising edge of the first positive half cycle (see 502). The chip enable is switched low to begin the write pulse just before the end of the half cycle that commenced the address setup (see 504). As discussed above, the write pulse width of a write pulse window 506 is about 12 ns. The data on the bus 518 is permitted to change during the write pulse window 506, but must be stable for the last 8 ns of the window, as shown at 508.

As noted above, the data does not have to change at exactly the same time for subsequent words. As also noted above, the CPU is getting one data word every cycle from main memory. Since only one copy can be done in every one and a half cycles, no data is changed on the third falling edge of the CPU clock (see 510 in FIG. 5). Thus, the data can be changed roughly two and a half half-cycles before the write completes, or one and a half half-cycles before the write completes.

There are eight different addresses for the eight words per copyin. During each copyin cycle only the three least significant bits of the 18 address bits are going to change. This is because the word at that address plus the seven words that follow it in memory are contiguous. Only three address output pads need to be driven during the CPU-to-cache copyin procedure.

A circuit diagram corresponding to an output pad driver of the CPU's address driver 304 will now be discussed with reference to FIG. 6. The circuit is formed in one micron C-MOS technology. The upper and lower sections labeled A and B are very similar in structure and function. An output stage 602 includes a pull-up n-channel FET 604 for driving a output pad 606 high, and a pull-down n-channel FET 605 for connecting the output pad 606 to ground.

Sections A and B each include precharging subcircuits 608 and 610, and pull-down subcircuits 612 and 614, respectively. The precharging subcircuits 608 and the pull-down subcircuit 612 control the electrical state of "NODE 1". Similarly, the precharging subcircuit 610 and the pull-down subcircuit 614 control the electrical state of "NODE 2".

Two invertors 616 and 618 are also formed in the same one micron C-MOS technology. The invertor 616 is used to invert the signal on NODE 1 to control the gate of transistor 604. The invertor 618 is used to invert the signal on NODE 2 to control the gate of transistor 605. The electrical states of NODEs 1 and 2 are never low at the same time. The invertors 616,618 are conventional; their particular structure is not critical to carrying out the present invention.

The state of the output pad 606 is determined by signals/FET's labeled as follows: CK1, CK2, CK1_DRIVE, CK2_DRIVE, CK1_PRECHARGE, CK2_PRECHARGE, CK1_DATA, CK2_DATA and the complements of CK1_DATA and CK2_DATA. In addition, the two feedback signals/FET's PULL_UPFB and PULL_DOWNFB are used in the precharge subcircuits.

The function of the driving circuit is to pull-up HIGH or pull-down LOW the output pad for one half cycle periods. This is done using a precharge/pulldown principle. NODEs 1 and 2 precharged and then, given the appropriate timing, a node is pulled-down to ground to either pull-up or pull-down the pad 406.

For example, once NODE 1 is precharged (pulled HIGH), either transistor chain (pull-down subcircuit) 620 or 622 can discharge the node to ground. When the node is pulled LOW, the output of the invertor 616 will go high, to thereby bias the gate of the n-channel FET 604. Biasing the gate of the FET 604 will turn it on and thereby drive the output pad 606 to the level of $V_{DL}$ (e.g., 3.3volts). Driving the output pad LOW is accomplished by pulling down NODE 2. With NODE 2 at ground, the invertor 618 drives the gate of the FET 608 to pull the pad 606 LOW.

The precharging and discharging of NODEs 1 and 2 will be discussed with reference to the 1.5 cycle copyin timing diagram in FIG. 7.

Signal CK1 corresponds to the actual CPU clock pulse and signal CK2 is its complement.

PULL_UPFB and PULL_DOWNFB are made small and are used to hold off against noise and leakage by biasing their respective node to $V_{DD}$. The gates of PULL_UPFB and PULL_DOWNFB are connected to the output of the invertors 616 and 618. For instance, when NODE 1 is precharged to $V_{DD}$ the output of invertor 616 is low thereby turning ON the PULL_UPFB FET to prevent NODE 1 from being discharged due to noise. The FETs PULL_UPFB and PULL_DOWNFB are made small so that when the circuit attempts to pull NODE 1 LOW, PULL_UPFB will not hold it HIGH. PULL_DOWNFB works in the same manner.

The "size" of the FETs refers to the amount of current they are able to sink. Their current carrying capacity is determined, for the most part, by their gate width. All of the n- and p-channel FETs have 1 micron gate lengths. The actual gate widths of all the FETs are dependant on the desired driver switching speed. Those of ordinary skill in the art will be able to determine the appropriate dimensions without undue experimentation, since the driver lends itself quite easily to computer aided simulation.

The circuit drives for an entire half cycle at a time. So when the driving of ADDRESS 0 begins, the pad is driven while the clock is HIGH. When the driving of ADDRESS 1 begins, driving occurs on the half cycle where the clock is LOW, because the driver is designed to operate every 1.5 cycles.

Consider driving the output for the two least significant bits of the address. The CK1_DATA, CK2_DATA, OUTPUT, NODE 1 and NODE 2 signals in FIG. 7 show the state for each of these two bits. The least significant bit is shown as a solid line and the second least significant bit is shown as a dashed line. In this example, the value of the three least significant bits is shown on the output signal transitions (e.g., 000→001→010→011).

Figure 7:
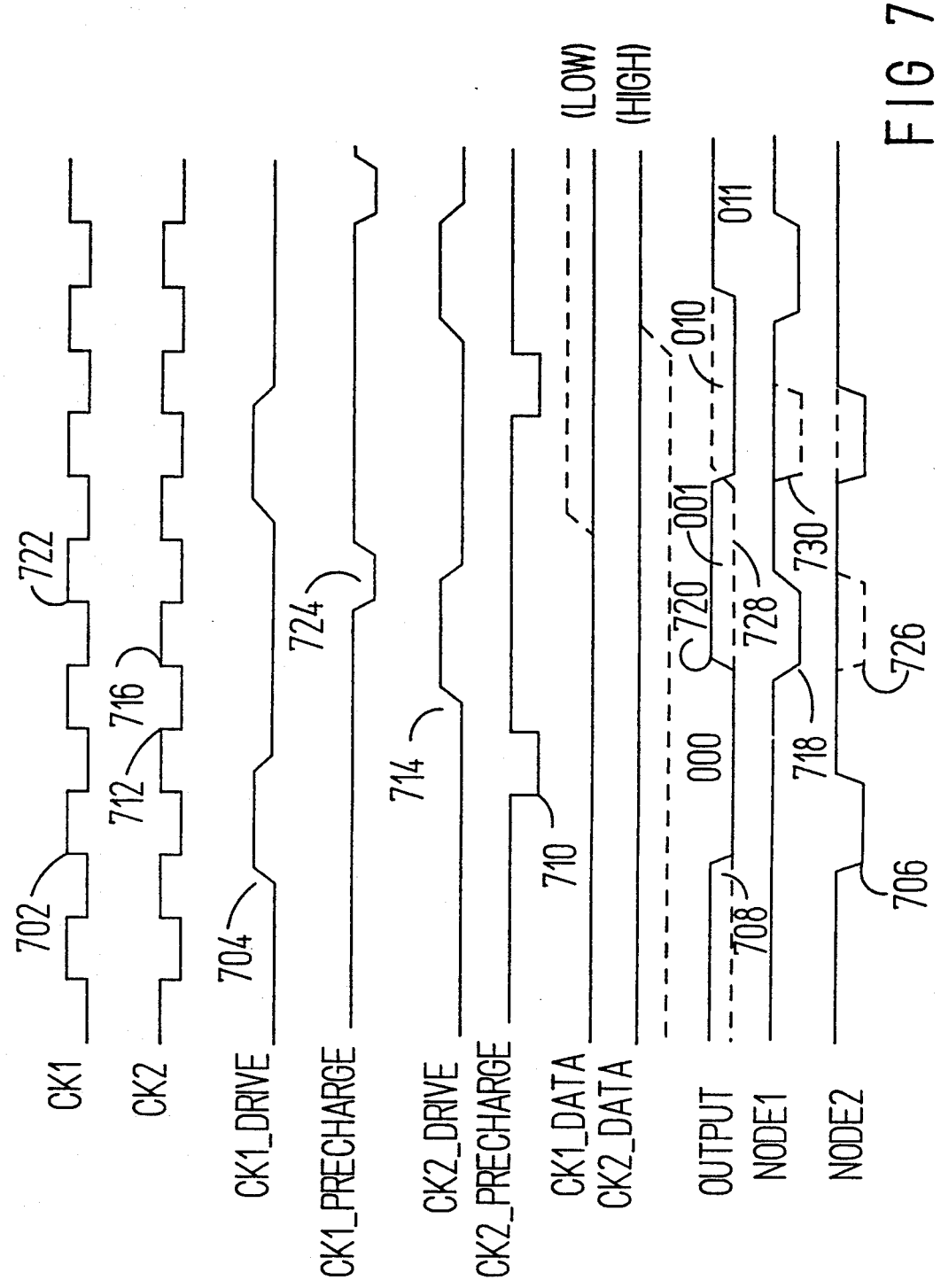
FIG. 7 shows a timing diagram for 1.5 cycle copyin timing in conjunction with the present invention.

In the example of FIG. 7, CK1_DATA and CK2_DATA are assumed to be LOW and HIGH, respectively. The following conditions are also assumed at the initial state shown at the left hand side of FIG. 7: CK1_DRIVE is LOW; CK1_PRECHARGE is HIGH; CK2_DRIVE is LOW; CK2_PRECHARGE is HIGH; OUTPUT is HIGH; and both NODEs 1 and 2 are HIGH.

Figure 6:
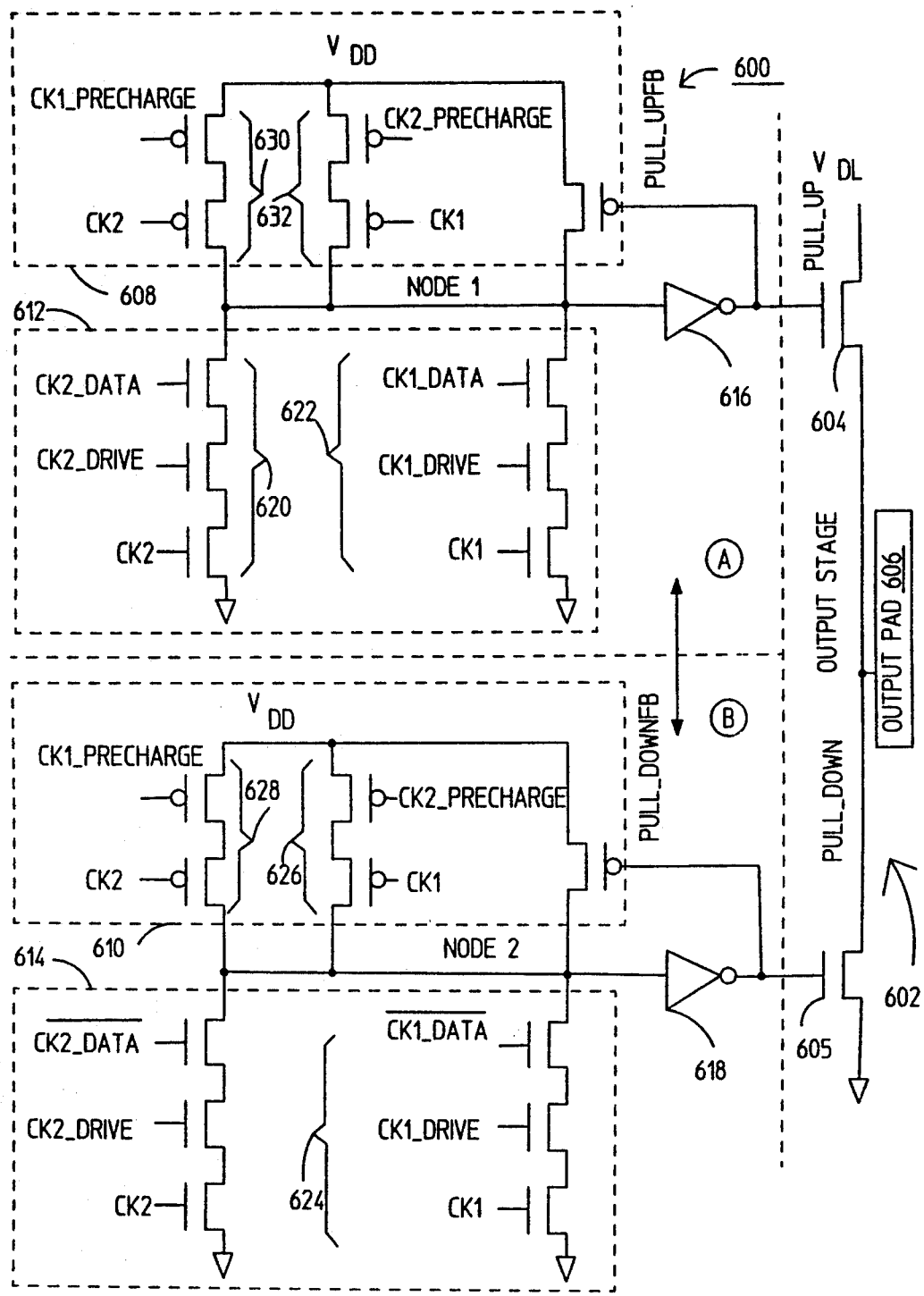
FIG. 6 shows a circuit diagram for an ASIC output driver in conjunction with the present invention.

The first OUTPUT stare "000" is triggered by transistor chain 624 in FIG. 6. Just prior to the second positive half cycle of CK1 (see 702), CK1_DRIVE switches from LOW to HIGH (see 704 of FIG. 7). Therefore, the FET corresponding to CK1_DRIVE in pull-down subcircuit 614 is turned ON. Because CK1_DATA is LOW, its complement FET in subcircuit 614 is also ON.

Once CK1 goes HIGH the corresponding FET in subcircuit 614 is turned ON and the chain 624 pulls NODE 2 to ground (see 706). With NODE 2 low, the invertor 618 causes FET 608 to turn ON and pull-down the OUTPUT (see 708). Note that NODE 1 is left HIGH (i.e., FET 604 is not turned ON) while the OUTPUT is changes by the pull-down of NODE 2. Once CK1 cycles LOW after NODE 2 is discharged, CK2 cycles HIGH and CK2_PRECHARGE goes LOW (see 701) to precharge NODE 2 to $V_{DD}$ (5 V for example), using a p-channel FET chain 626. (Note that p-channel FETs conduct when LOW signals are applied to their gate electrodes.)

The other three precharging chains 628, 630 and 632 connect their respective node (NODE 1 or NODE 2) to $V_{DD}$ in a similar fashion on the half cycle following a discharge. The discharging of NODEs 1 and 2 is synonymous with the term "pull-down", as well as with the term "drive", because when either node id discharged the OUTPUT is "driven" HIGH or LOW.

Switching of the OUTPUT (and output pad) from address "000" to "001" is accomplished by FET chain 620 as follows. Once the precharging of NODE 2 is completed at the end of CK2 half cycle 712, CK2_PRECHARGE is switched HIGH.

Following a short delay, CK2_DRIVE is switched HIGH, as shown at 714. The FET corresponding to CK2_DRIVE in pull-down subcircuit 612 is then turned ON. ON the next HIGH half cycle of CK2 (see 716) NODE 1 is pulled down by FET chain 620, because the FET corresponding to CK2 also turned ON. The LOW signal at NODE 1 causes the invertor 616 to turn ON FET 604 in the output stage, thus pulling-up the output pad 606 to a HIGH level. FIG. 7 shows the address change from "000" to "001" on the OUTPUT signal (see 720).

The next HIGH CK1 half cycle (722) causes the CK1_PRECHARGE to switch LOW (726). NODE 1 is then precharged because both CK1_PRECHARGE and CK2 are LOW (see FET chain 630).

The OUTPUT signal sequence for the address changes from "001" to "010" and from "010" to "011" are performed in the same manner as the above signal sequences.

The dashed line in FIG. 7 show the signal sequences for the second least significant bit for the output address. At the same time NODE 1 is discharged, as shown at 720, NODE 2 on a second driver, which corresponds to the output pad for that bit, it also discharged. The output pad for the second least significant bit is thus kept LOW (see 728).

On the next 1.5 cycle NODE 1 of the second least significant bit's driver circuit is discharged, as shown at 730. This causes the second least significant bit's output pad to be pulled HIGH, as shown at 732. The signal sequence for the second least significant bit's CK1_DRIVE and CK2_DRIVE signals are also shown in FIG. 7.

The third least significant bit's driver circuitry switches its output pad during 1.5 cycles using the same logic set forth above.

The DRIVE and the PRECHARGE signals are related to each other in that the PRECHARGE signals can be created from the DRIVE signals. Referring again to FIG. 7, one can see that if CK1_DRIVE was HIGH, CK2_PRECHARGE will be pulled LOW. These two events go hand-in-hand. Therefore, the driver circuit can DRIVE on CK1 and PRECHARGE on CK2, and vise versa. Furthermore, the PRECHARGE signals can switch earlier in the half cycles in which they are shown to go LOW (precharge) in FIG. 7. Similarly, they can go HIGH (stop charging) anytime in the half-cycle where they are shown to go HIGH. A situation to be avoided is having a PRECHARGE signal LOW while trying to DRIVE the output pad. The circuit can not be driving and precharging at the same time. The circuit can either PRECHARGE anytime it is not DRIVING, or it can just PRECHARGE after each DRIVE.

Figure 8:
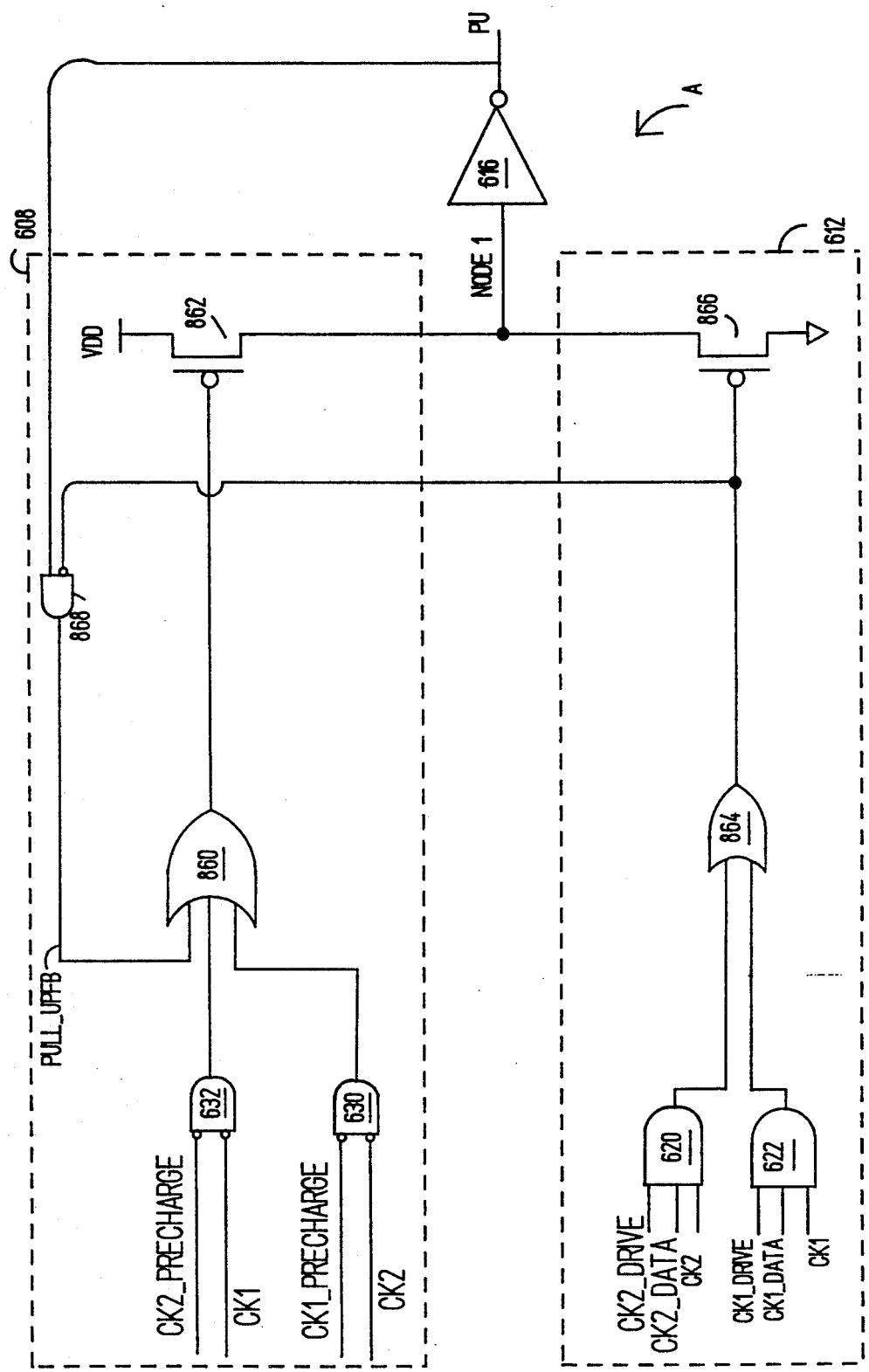
FIG. 8 shows a logic gate diagram for half of the circuit in FIG. 6.

A logic diagram for section A, including the precharging subcircuit 608 and the pull-down subcircuit 612 is shown in FIG. 8.

The precharge transistor chain 630 of FIG. 6 is represented as an AND gate with its inputs CK1_PRECHARGE and CK2 inverted. Similarly, the precharge transistor chain 632 of FIG. 6 is represented as an AND gate with its inputs CK2_PRECHARGE and CK1 inverted. The outputs of the two AND gates are fed along with the PULL_UPBF feedback logic signal to the inputs of a three input NOR gate 860. To precharge NODE 1 to the power supply $V_{DD}$, the output of the NOR gate 860 is used to control the gate of a p-channel field effect transistor 862. As in FIG. 6, the logic state of NODE 1 is inverted by the invertor 616 to drive the pull-up FET 604 (not shown in FIG. 8).

The pull-down transistor chain 620 of FIG. 6 is represented as a three input AND gate with inputs CK2_DRIVE, CK2_DATA and CK2. Similarly, the pull-down transistor chain 622 of FIG. 6 is represented as a three input AND gate with inputs CK1_DRIVE, CK1_DATA and CK1. The outputs of the two AND gates are fed to the inputs of a two input OR gate 864. To pull-down (discharge) NODE 1 to the ground, the output of the OR gate 864 is used to control the gate of a n-channel field effect transistor 866.

The output of the OR gate 864 is also fed to the inverted input of an AND gate 868 to prevent subcircuit 608 from precharging NODE 1 when subcircuit 612 is pulling it down to ground to drive the output pad HIGH (i.e., the OR gate 864 goes HIGH to turn ON FET the 866 and pull NODE 1 to ground, thereby causing the invertor 616 to set PU HIGH and turn on FET 604 to drive the pad). This logic represents the ability of the pull-down chains in subcircuits 612 and 164 to overdrive the small PULL_UPFB and PULL_DOWNFB FETs.

The timing of the DRIVE and PRECHARGE signals, as well as the other signals in conjunction with the present invention, may vary depending on criteria, such as clock speed, desired bandwidth and output signal strength, etc. The scope of the invention should not be limited to the specific signal sequences discussed above.

An alternative circuit may be used in place of each pull-down transistor chain 622 and 624. Pluralities of these alternate circuits may be tied in parallel to implement a multiplexing function between CPU internal address buses, where the buses would share one driver for writing to the instruction cache memory. In this further example, mutually exclusive control signals and additional cross-coupled logic would be necessary to specify which of the circuits would be used to pull-down the respective node. No two circuits should be permitted to pull-down a node at the same time.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents. It will be understood by those skilled in the art that various changes in form and detail may be made therein without departing from the spirit and scope of the invention.

Having thus described our invention, what we claim as new and desire to secure by Letters Patent is:

1. An output driver located on a semiconductor chip and having an output pad for transferring information off-chip, said output driver comprising:
   a first circuit electrically connected to said output pad for switching said output pad to a first logic state, said first circuit comprising:
      a first precharging subcircuit for placing a first node in said first logic state, and wherein said first precharging subcircuit further comprises:
         i) a first transistor chain; and
         ii) a second transistor chain;
      a first pull-down subcircuit for placing said first node in said second logic state; and
      a first switch connected to and controlled by said first node for connecting the output pad to a first voltage potential to achieve said first logic state;
   a second circuit electrically connected to said output pad for switching said output pad to a second logic state, said second circuit comprising:
      a second precharging subcircuit for placing a second node in said first logic state, and wherein said second precharging subcircuit further comprises:
         i) a third transistor chain; and
         ii) a fourth transistor chain;
      a second pull-down subcircuit for placing said second node in said second logic state; and
      a second switch connected to and controlled by said second node for connecting the output pad to a second voltage potential to achieve said second logic state;
   means for controlling said first and second circuits to perform said switching between said first and second logic states at integer and integer and a half clock cycles on any half clock cycle following a half clock cycle in which said output pad was not driven;
   a first invertor connected between said first node and said first switch, for switching the output pad to said first state when said first node is in said second state; and
   a second invertor connected between said second node and said second switch, for switching the output pad to said second state when said second node is in said second state;
   and wherein the output driver further comprises means for one of:
      i) applying a clock signal and a first precharge signal to one of:
         a) said first transistor chain to bias the first node to said first state; and
         b) said third transistor chain to bias the second node to said first state; and
      ii) applying a complement of said clock signal and a second precharge signal to one of:
         a) said second transistor chain to bias the first node to said first state; and
         b) said fourth transistor chain to bias the second node to said first state.

2. An output driver according to claim 1, wherein:
   said first pull-down subcircuit further comprises:
      i) a fifth transistor chain; and
      ii) a sixth transistor chain; and
   said second precharging subcircuit further comprises:
      i) a seventh transistor chain; and
      ii) an eighth transistor chain;
   and wherein the output driver further comprises means for one of:
      i) applying said clock signal, a first drive signal and a first data signal to said fifth transistor chain to bias said first node to said second state and thereby drive the output pad to said first logic state;
      ii) applying said complement clock signal, a second drive signal and a second data signal to said sixth transistor chain to bias the first node to said second state and thereby drive the output pad to said first logic state;
      iii) applying said clock signal, said first drive signal and a complement of said first data signal to said seventh transistor chain to bias the second node to said second state and thereby drive the output pad to said second logic state; and
      iv) applying said complement clock signal, said second drive signal and a complement of said second data signal to said eighth transistor chain to bias the second node to said second state and thereby drive the output pad to said second logic state.

3. An output driver, including an output pad, for performing write operations from a central processor unit to a cache memory, comprising:
   a first circuit electrically connected to the output pad for switching the output pad to a first logic state, said first circuit comprising:
      a first precharging subcircuit for placing a first node in said first logic state, and wherein said first precharging subcircuit further comprises:
         i) a first transistor chain; and
         ii) a second transistor chain;
      a first pull-down subcircuit for placing said first node in said second logic state; and
      a first switch connected to and controlled by said first node for connecting the output pad to a first voltage potential to achieve said first logic state;
   a second circuit electrically connected to the output pad for switching the output pad to a second logic state, said second circuit comprising;
      a second precharging subcircuit for placing a second node in said first logic state, and wherein said second precharging subcircuit further comprises:
         i) a third transistor chain; and ii) a fourth transistor chain;
a second pull-down subcircuit for placing said second node in said second logic state; and
a second switch connected to and controlled by said second node for connecting the output pad to a second voltage potential to achieve said second logic state;
means for controlling said first and second circuits to perform said switching between said first and second logic states at integer and integer and a half clock cycles on any half clock cycle following a half clock cycle in which said output pad was not driven;
a first invertor connected between said first node and said first switch, for switching the output pad to said first state when said first node is in said second state; and
a second invertor connected between said second node and said second switch, for switching the output pad to said second state when said second node is in said second state;
and wherein the output driver further comprises means for one of:
i) applying a clock signal and a first precharge signal to one of:
a) said first transistor chain to bias the first node to said first state; and
b) said third transistor chain to bias the second node to said first state; and
ii) applying a complement of said clock signal and a second precharge signal to one of:

a) said second transistor chain to bias the first node to said first state; and
b) said fourth transistor chain to bias the second node to said first state.

4. An output driver according to claim 3, wherein:
said first pull-down subcircuit further comprises:
i) a fifth transistor chain; and
ii) a sixth transistor chain; and
said second precharging subcircuit further comprises:
i) a seventh transistor chain; and
ii) an eighth transistor chain;
and wherein the output driver further comprises means for one of:
i) applying said clock signal, a first drive signal and a first data signal to said fifth transistor chain to bias said first node to said second state and thereby drive the output pad to said first logic state;
ii) applying said complement clock signal, a second drive signal and a second data signal to said sixth transistor chain to bias the first node to said second state and thereby drive the output pad to said first logic state;
iii) applying said clock signal, said first drive signal and a complement of said first data signal to said seventh transistor chain to bias the second node to said second state and thereby drive the output pad to said second logic state; and
iv) applying said complement clock signal, said second drive signal and a complement of said second data signal to said
eighth transistor chain to bias the second node to said second state and thereby drive the output pad to said second logic state.

* * * * *